(12) United States Patent
Weston et al.

(10) Patent No.: US 9,333,811 B2
(45) Date of Patent: May 10, 2016

(54) 1-D TIRE PATCH APPARATUS AND METHODOLOGY

(71) Applicants: COMPAGNIE GENERALE DES ETABLISSEMENTS MICHELIN, Clermont-Ferrand (FR); MICHELIN RECHERCHE et TECHNIQUE S.A., Granges-Paccot (CH)

(72) Inventors: David Alan Weston, Greenville, SC (US); Raymond Leslie Hodgkinson, Greenville, SC (US)

(73) Assignees: Compagnie Generale Des Etablissements Michelin (FR); Michelin recherche et Technique S.A. (CH)

( * ) Notice: Subject to any disclaimer, the term of this patent is extended or adjusted under 35 U.S.C. 154(b) by 103 days.

(21) Appl. No.: 14/250,569

(22) Filed: Apr. 11, 2014

(65) Prior Publication Data

US 2014/0215785 A1    Aug. 7, 2014

Related U.S. Application Data

(60) Division of application No. 13/059,096, filed as application No. PCT/US2009/042357 on Apr. 30, 2009, now Pat. No. 8,742,265, which is a continuation-in-part of application No. PCT/US2008/074765, filed on Aug. 29, 2008.

(51) Int. Cl.
*B21D 39/03* (2006.01)
*B60C 19/00* (2006.01)
(Continued)

(52) U.S. Cl.
CPC ............. *B60C 19/00* (2013.01); *B60C 23/0411* (2013.01); *B60C 23/0493* (2013.01);
(Continued)

(58) Field of Classification Search
CPC  B60C 23/0411; B60C 23/0493; B60C 19/00; B60C 2019/004; G01M 17/02; H01L 41/25; H01L 41/1132; B29D 2030/0072; Y10T 29/49826; Y10T 29/49538; Y10T 428/24479; Y10T 29/42
See application file for complete search history.

(56) References Cited

U.S. PATENT DOCUMENTS 4,203,481 A   5/1980  Ranik, Jr.
4,334,215 A * 6/1982  Frazier ................ B60C 23/0433
                                                    116/34 R
(Continued)

FOREIGN PATENT DOCUMENTS

JP    2-195223    8/1990
JP    2007163230  1/1998
(Continued)

OTHER PUBLICATIONS

PCT International Search Report for PCT/US2009/042357, dated Sep. 8, 2009.
(Continued)

*Primary Examiner* — Hoa C Nguyen
(74) *Attorney, Agent, or Firm* — Dority & Manning, P.A.

(57) ABSTRACT

Disclosed is a tire mountable apparatus and method that includes a substrate defining a longitudinal direction, a top surface and a bottom surface. The substrate has a plurality of conductor terminals arranged in a substantially linear relationship. A first support element is located below the bottom surface of the substrate and a second support element is located above the top surface of the substrate. The plurality of conductor terminals are positioned between the first and second support elements. The substrate may be a piezoelectric device having a piezoelectric layer arranged between first and second conductive layers. The plurality of conductor terminals may be arranged in a substantially linear relationship along a line about 80° to about 100° to the longitudinal direction of the substrate, and the longitudinal direction of the substrate being substantially perpendicular to the direction of rotation of the tire.

7 Claims, 5 Drawing Sheets

(51) Int. Cl.
- *H01L 41/113* (2006.01)
- *B60C 23/04* (2006.01)
- *G01M 17/02* (2006.01)
- *H01L 41/25* (2013.01)
- *B29D 30/00* (2006.01)

(52) U.S. Cl.
CPC ........... *G01M17/02* (2013.01); *H01L 41/1132* (2013.01); *H01L 41/25* (2013.01); *B29D 2030/0072* (2013.01); *B60C 2019/004* (2013.04); *Y10T 29/42* (2015.01); *Y10T 29/49538* (2015.01); *Y10T 29/49826* (2015.01); *Y10T 428/24479* (2015.01)

(56) References Cited

U.S. PATENT DOCUMENTS

| | | | |
|---|---|---|---|
| 5,747,916 | A | 5/1998 | Sugimoto et al. |
| 6,093,997 | A | 7/2000 | Zimnicki et al. |
| 6,359,532 | B1 | 3/2002 | Sugiyama et al. |
| 6,505,515 | B1 | 1/2003 | Delaporte |
| 6,782,741 | B2 * | 8/2004 | Imbert ............... B60C 23/0493 152/152.1 |
| 6,951,143 | B1 | 10/2005 | Adderton et al. |
| 7,186,308 | B2 * | 3/2007 | Metcalf ............... B60C 23/0493 152/152.1 |
| 7,278,455 | B2 | 10/2007 | Hedo et al. |
| 7,703,493 | B2 | 4/2010 | Willard, Jr. |
| 2003/0056351 | A1 | 3/2003 | Wilkie et al. |
| 2003/0209063 | A1 | 11/2003 | Adamson et al. |
| 2003/0209064 | A1 | 11/2003 | Adamson |
| 2005/0257868 | A1 | 11/2005 | Adamson |
| 2006/0260390 | A1 * | 11/2006 | Oflaz ................. B60C 23/0411 73/146 |
| 2007/0012391 | A1 | 1/2007 | Willard, Jr. |
| 2010/0148950 | A1 * | 6/2010 | Yamaguchi ......... G01L 19/0609 340/442 |

FOREIGN PATENT DOCUMENTS

| | | |
|---|---|---|
| JP | H11326087 | 11/1999 |
| JP | 2000/097794 | 4/2000 |
| JP | 2002/502765 | 1/2002 |
| JP | 2002/541003 | 12/2002 |
| JP | 2005/214829 | 8/2005 |
| JP | 2005/335692 | 12/2005 |
| JP | 2006/151372 | 6/2006 |
| JP | 2007/163230 | 6/2007 |
| JP | 2007/176479 | 7/2007 |
| JP | 2007/532909 | 11/2007 |
| WO | WO 01/80327 A1 | 10/2001 |
| WO | WO 03/095245 A1 | 11/2003 |
| WO | WO 2005/012282 | 2/2005 |
| WO | WO 2005/095900 | 10/2005 |
| WO | WO 2006/003934 | 1/2006 |
| WO | WO 2006/054983 A1 | 5/2006 |
| WO | WO 2006/071228 A1 | 7/2006 |
| WO | WO 2006/071229 A1 | 7/2006 |
| WO | WO 2006/071230 A1 | 7/2006 |
| WO | WO 2006/135366 | 12/2006 |
| WO | WO 2008/059838 | 5/2008 |

OTHER PUBLICATIONS

International Search Report for corresponding Japanese Application No. PCT/JP2004/012270, mailed on May 28, 2015, 1 page.

* cited by examiner

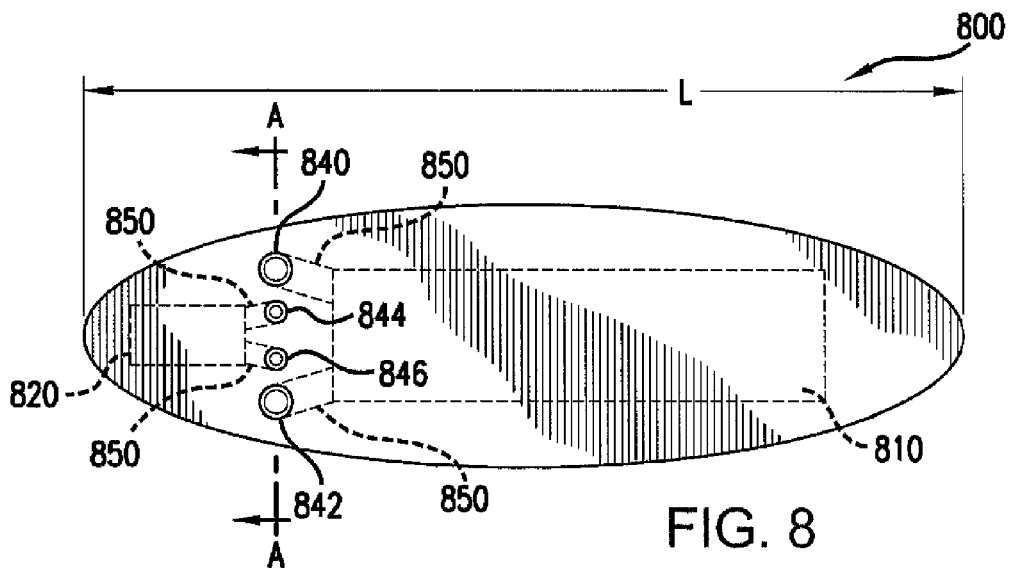
FIG. 8
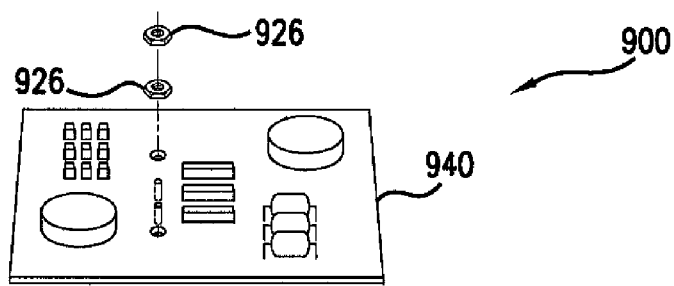
FIG. 9
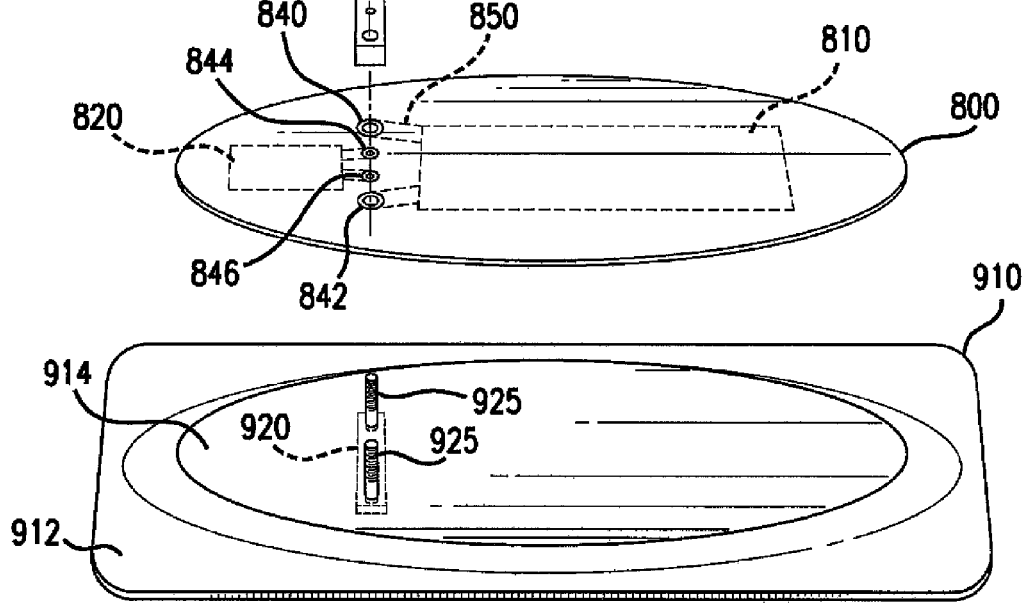

1-D TIRE PATCH APPARATUS AND METHODOLOGY

FIELD OF THE INVENTION

The present subject matter relates to a tire apparatus. In particular, the present subject matter relates to apparatus having length and width dimensions related to physical aspects associated with tires in which it may be mounted for providing enhanced endurance of the tire apparatus. The present subject matter also relates to the use of such tire apparatus or structures to obtain enhanced operational and endurance characteristics for devices supported by such structures.

BACKGROUND OF THE INVENTION

The incorporation of electronic devices with tire structures has been shown to yield many practical advantages. Tire electronics may provide their own power source whose operation depends on tire related phenomena and may also include sensors and other components for obtaining information regarding various physical parameters of a tire, such as temperature, pressure, number of tire revolutions, tire rotation speed, etc. Such information may be useful in tire monitoring and warning systems, and may even be employed with feedback systems to monitor proper tire pressure levels.

United States Published Patent Application 2003/0209063 (Adamson et al.) is directed to a system and method for generating electric power from a rotating tire's mechanical energy using piezoelectric fiber composites.

United States Published Patent Application 2003/0056351 (Wilkie et al.) is directed to a piezoelectric micro-fiber composite actuator and a method for making the same.

U.S. Pat. No. 6,093,997 (Zimnicki et al.) is directed to a piezoelectric resonator embedded within an electrically insulating substrate assembly, such as a multilayer printed circuit board.

U.S. Pat. No. 5,747,916 (Sugimoto et al.) is directed to a piezoelectric transformer unit which transforms an input voltage into an output voltage and which includes a piezoelectric transformer element driven by high electric power.

The disclosures of all of the foregoing United States patent and published patent applications are hereby fully incorporated into this application for all purposes by reference thereto. While various implementations of piezoelectric generators have been developed, and while various combinations of tire characteristic monitoring devices have been implemented, no design has emerged that generally encompasses all of the desired characteristics as hereafter presented in accordance with the subject technology.

SUMMARY OF THE INVENTION

In view of the recognized features encountered in the prior art and addressed by the present subject matter, an improved tire mountable apparatus and methodology for providing enhanced endurance for tire patches and associated supported devices and structures has been provided.

In one particular embodiment, a tire mountable apparatus may include a substrate defining a longitudinal direction, a top surface and a bottom surface. The substrate may have a plurality of conductor terminals arranged in a substantially linear relationship. The tire mountable apparatus may include a first support element located below the bottom surface of the substrate and a second support element located above the top surface of the substrate. The plurality of conductor terminals may be positioned between the first and second support elements.

In another exemplary embodiment of the present invention, a method is provided that corresponds to positioning a first support element beneath the bottom surface of the substrate so that the first support element overlaps the plurality of conductor terminals of the substrate and positioning a second support element above the top surface of the substrate so that the second support element overlaps the plurality of conductor terminals of the substrate.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 8 representatively illustrates a plan view of an exemplary substrate in accordance with one embodiment of the present technology;

FIG. 9 representatively illustrates an exploded view of an exemplary tire mountable apparatus in accordance with one embodiment of the present technology.

Figure 1:
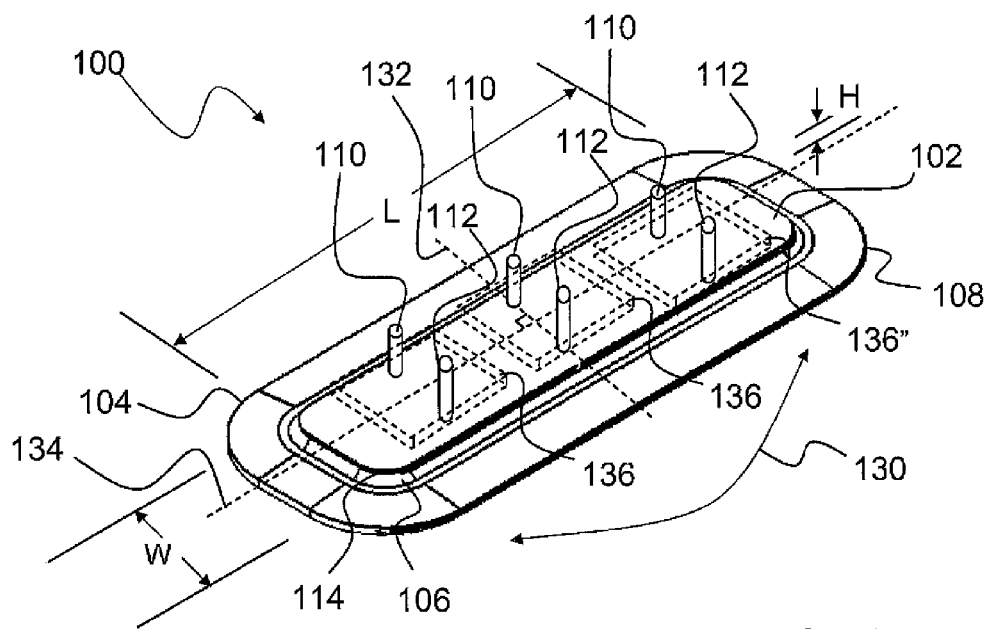
FIG. 1 diagrammatically illustrates a 1-D tire mountable apparatus constructed in accordance with present technology.

Repeat use of reference characters throughout the present specification and appended drawings is intended to represent same or analogous features or elements of the invention.

DETAILED DESCRIPTION OF THE PREFERRED EMBODIMENTS

Aspects of the present subject matter may be concerned with a 1-D tire mountable apparatus having a length and width related to certain aspects of the tires in which the apparatus may be mounted. It should be appreciated in the following discussion that the term "1-D" is primarily intended to represent that the tire mountable apparatus of the present technology is so designated, not because it actually has only one dimension, but rather to emphasize the fact that the width dimension is significantly less than the length dimension for reasons that will be more fully explained later. Of course also, the apparatus does have a height as the device is actually a three-dimensional object, but such height also, relative to the length is significantly less.

Further, it should be appreciated that, as employed later herein with respect to certain embodiments of the present technology, the term "generator" is meant to convey that flexure of a piezoelectric device as may be associated with the present subject matter will produce an output voltage across output terminals provided on the device. Further still, as the piezoelectric device associated with the present technology may be employed as a sensor as well as a generator either separately or concurrently, the terms generator and sensor may be used hereinafter interchangeably.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject 1-D tire mountable apparatus and methodology. Referring now to the drawings, FIG. 1 diagrammatically illustrates 1-D tire mountable apparatus 100 constructed in accordance with present technology. As may be seen from FIG. 1, 1-D tire mountable apparatus 100, of course, actually has three dimensions. In particular, a substrate portion of apparatus 100 which may be configured as a sandwich structure 102 is constructed as indicated in FIG. 1 as having a length L and width W. Further, the width dimension W is significantly less than the length L. In preferred embodiments, L is at least twice W.

Also illustrated as an optional portion of tire mountable apparatus 100 is an elastomeric patch 108 that has a top surface 114 and a lower surface 104 separated by a mesa 106 having a height H. In accordance with present technology the height H is less than either the width W or length L.

Figure 4:
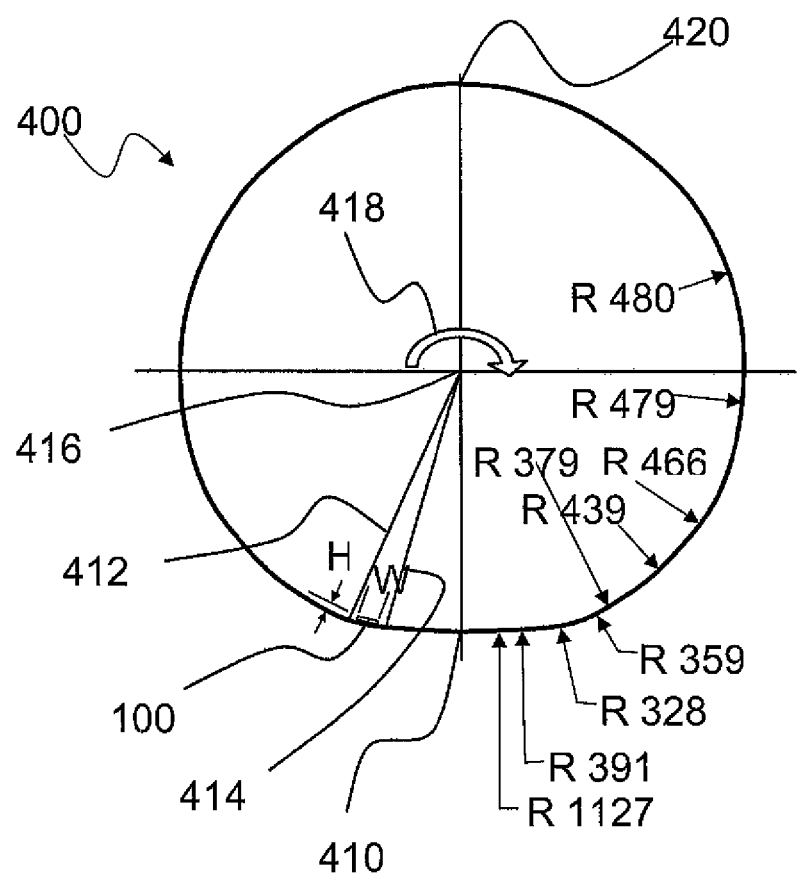
FIG. 4 representatively illustrates variations in the radius of curvature of an exemplary tire in which the present technology may be employed.

With brief reference to FIG. 4, those of ordinary skill in the art will appreciate that a tire operating under rated pressure and rated load will have a profile similar to that illustrated in FIG. 4. This profile includes a generally flat area normally described as the contact patch with curved portions on either side of the contact patch. Further, there are transition areas immediately preceding and following the contact patch where the radius of curvature of a tire operating under rated pressure and rated load changes from a substantially constant radius to a generally flat or infinite radius. As will be explained further hereinafter, the width W of tire mountable apparatus 100 is selected to fall within these transition areas. More particularly, the width W is selected to fall within a somewhat narrower width as will be more fully explained later with respect to FIG. 6.

As will be explained further later, the device of the present technology is referred to herein as a "1-D" device based generally on the concept that the present technology has provided a device that, when including a piezoelectric device, provides for the generation of an output signal having substantial energy for harvesting as a result of strain applied principally from only one dimension, i.e., the relatively longer length dimension of the device. Conversely, strain applied from the shorter dimension, the width W of the device, provides less signal production than that along the longer length dimension, but may still provide a signal opportunity if interpreted correctly. Further, when employed as a support structure for printed circuit board mounted electronics, the 1-D tire mountable apparatus provides a substantially strain free mounting arrangement for such printed circuit boards. These concepts will be more fully explained with reference to FIGS. 3 and 4 herein after.

With further reference to FIG. 1, it will be seen that 1-D tire mountable apparatus 100 corresponds, in one embodiment, to an optional elastomeric patch having a substrate that may correspond to a sandwich structure 102. Sandwich structure 102, in an exemplary embodiment may correspond to a layer of piezoelectric material, conductive layers and at least one support layer as will be explained more fully with respect to FIG. 2 that may function as a sensor or voltage generators.

A substrate in accordance with present technology, possibly in the form of sandwich structure 102, may be supported on an optional layer of elastomeric material 108 to form a patch that may be secured to the inner liner of a tire using standard tire patch repair methodologies. Elastomeric material 108 may be formed as a lower surface 104 and a centrally located raised mesa portion 106 having a top surface 114 on which sandwich structure 102 may be secured. In general, the elastomeric material may correspond to a material composition normally employed as a sidewall material in the construction of pneumatic tires. As those of ordinary skill in the art will appreciate, such material is a generally oxidation-resistant compound.

In an exemplary embodiment of the present subject matter, a tire patch assembly may be produced by coating an adhesive on a portion of sandwich structure 102, placing the structure in a specially designed mold configured to accommodate sandwich structure 102, filling the remainder of the mold with an elastomeric material and curing the patch. A patch so formed may then be secured to the inner liner of a tire using standard tire patch repair methods. In an exemplary configuration, the adhesive may be Chemlok® available from LORD Corporation and the elastomeric material may correspond to rubber.

In accordance with another exemplary embodiment of the present subject matter, it is possible to secure sandwich structure 102 directly to the inner liner of a tire using Chemlok® alone without the intermediary use of the elastomeric material. It should also be appreciated that a tire mountable apparatus constructed in accordance with present technology may be similarly mounted to a non-pneumatic tire and wheel combination known as a Tweel® non-pneumatic tire, manufactured by the owner of the present technology.

Figure 2:
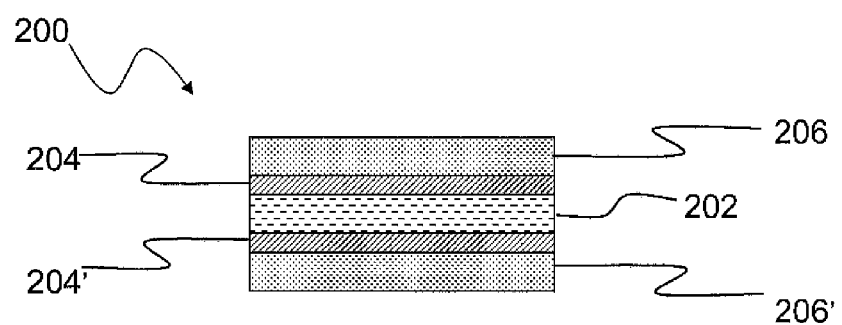
FIG. 2 diagrammatically illustrates the sandwich construction of a piezoelectric generator as may be associated with a 1-D tire mountable apparatus constructed in accordance with present technology.

With brief reference now to FIG. 2, there is illustrated an exemplary sandwich structure 200, corresponding to sandwich structure 102 of FIG. 1. Sandwich structure 200 corresponds to a layer of piezoelectric material 202 with a first layer of conductive material 204 on one side thereof and a second layer of conductive material 204' on a second side thereof. The first layer of conductive material 204 is secured to a layer of insulating material 206 that acts as a supporting substrate for the sandwich structure 200. In exemplary embodiments of the present subject matter, piezoelectric material 202 may correspond to lead zirconium titanate (PZT), conductive materials 204, 204' may comprise copper layers, and insulating material 206 may correspond to a fire resistant substrate material commonly called FR4.

In another exemplary embodiment of the present subject matter, an optional second layer of insulating material 206' may be secured to conductive layer 204'. Such a second layer of insulating material, if provided, may also be FR4.

With further reference to FIG. 1, a pair of connection/support terminals or posts 110, 112 is positioned along line 132 and on either side of central line 134. Terminal 110 may be electrically coupled to conductive layer 204 while terminal 112 may be electrically coupled to conductive layer 204'. It should be appreciated by those of ordinary skill in the art that the connection/support terminal configurations described are exemplary only as other configurations are possible and are also contemplated by the present technology. For example, while the present disclosure generally illustrates a sandwich structure 102 substantially completely covering and even, optionally, partially overhanging the top surface 114 of patch 108, such are not specific limitations of the present technology as sandwich structure 102 may actually be sub-divided into two or more portions. Further, while a pair of connection/support terminals 110, 112 are illustrated, there may be provided additional such connection/support terminals positioned along a common line with connection/support terminals 110, 112 or along parallel lines as illustrated at 110', 112' and 110", 112". Further still, in embodiments where sandwich structure 102 may be sub-divided into two or more portions, such portions may be electrically connected in parallel by way of connection/support terminals 110, 112 or in other electrical configurations as desired including serially or individually by providing additional connection/support terminals.

A significant aspect of the present disclosure is that the pair of connection/support terminals 110, 112 is positioned along line 132, or, more generally, along a line perpendicular to central line 134, where central line 134 is along the primary bending direction 130 of the 1-D tire mountable apparatus 100. In accordance with present technology, lines 132 and 134 may vary from true perpendicular (i.e. 90°) alignment by ±10, ±5, or ±2 degrees. As will be made clear later, line 132 may be said to identify the direction of rotation of a tire in which a tire mountable apparatus constructed in accordance with the present technology is to be mounted. In general, because the primary bending direction 130 is along central line 134, line 132 and hence the mounting position for pair of connection/support terminals 110, 112 may be positioned anywhere along central line 134, however the preferred position is generally at a more central location as illustrated.

As will be explained further later, when 1-D tire mountable apparatus 100 is positioned in a tire in accordance with present technology, a primary bending direction as illustrated by double-arrowed line 130 is established due to the positioning of the 1-D tire mountable apparatus 100 in the tire as well as the length L and width W of the 1-D tire mountable apparatus 100.

With bending limited to along this one dimension, i.e. the 1-D direction, strain at and between connections to devices mounted to connection/support terminals 110, 112 and alternately or in addition connection/support terminals 110', 112' and 110", 112", is minimized due to their perpendicular alignment to the primary strain direction, i.e. the 1-D orthogonal connection line 132. If, for example, on the other hand, connection/support terminals 110, 112 were to be positioned along central line 134, the primary bending line, separation distances between connection/support terminals 110, 112 would change with any bending along central line 134. Such would place a significant strain on any device or printed circuit board 136 (illustrated in phantom in FIG. 1) and alternately or in addition circuit boards 136', 136" as may be mounted to connection/support terminals 110, 112 and/or connection/support terminals 110', 112' and/or 110", 112". It should be appreciated that any printed circuit board 136, 136', 136" mounted to their corresponding connection/support terminals may be mounted in such a manner that the connection/support terminals provide all of the support for the printed circuit board. That is, the printed circuit boards may be mounted such that they are not supported by contact with any underlying structure other than the connection/support terminals.

In certain exemplary embodiments of the present invention, the multiple circuit boards 136, 136', 136" are not physically coupled together to take advantage of the perpendicular to the primary strain direction orientation of the support terminals. In a particular embodiment, no additional pins are provided in parallel line alignment with the alignment line of the pair of support terminals 110, 112 and coupled to the same printed circuit board. Additional support terminals may, however, be placed along the same line with support terminals 110, 112.

Figure 5:
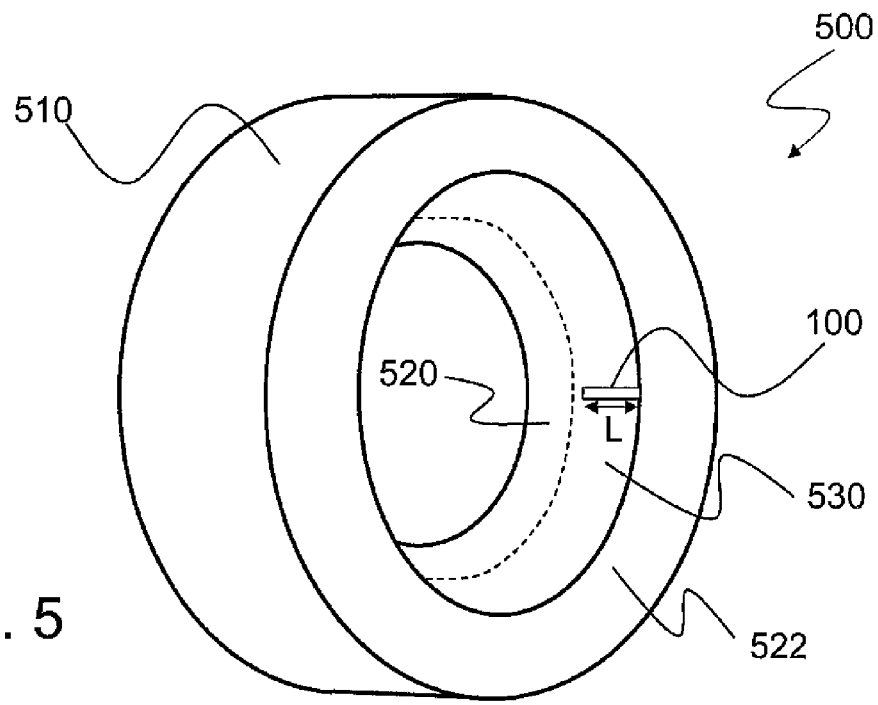
FIG. 5 generally represents an exemplary tire and illustrates the mounting position and orientation of the 1-D tire mountable apparatus therein.

With brief reference to FIG. 5, there is generally illustrated a tire 500 having a tread portion 510 and sidewall portions 520, 522. In accordance with present technology, 1-D tire mountable apparatus 100 is mounted laterally between sidewall portions 520, 522 in the central portion of tire summit 530. As may be seen in FIG. 5, 1-D tire mountable apparatus 100 may be mounted on the inner liner of tire 500 oriented such that the length dimension L extends in the direction of sidewalls 520, 522, i.e., is aligned substantially laterally to the direction of rotation of tire 500. Stated differently, the patch pose angle of the 1-D tire mountable apparatus is such that the dimension L is aligned substantially 90° to the direction of rotation of tire 500. It should be appreciated that in the present context, the phrase "aligned substantially" in a particular direction is intended to signify that there may be a variation in alignment from a perfect alignment in the range from about ±0° to about ±20°, such as ±5° to about ±15°, such as about ±8° to ±12°, such as about ±10°, such as about ±5°, or about ±4°, or about ±3°, or about ±1° or any other variation in alignment or range of variation in alignment therebetween.

Using the teachings disclosed herein, those of ordinary skill in the art should appreciate that certain embodiments of the present invention may not be limited to any particular orientation of the tire mountable apparatus 100. For example, in certain embodiments, the tire mountable apparatus 100 may be mounted closer to, or even directly on, sidewall portions 520 or 522 of the tire. In these embodiments, the length dimension of the tire mountable apparatus 100 may be aligned in any direction.

In exemplary configurations, the length dimension may be chosen such that tire mountable apparatus 100 lies in the central portion of the tire summit and extends over a significant portion of that area of a belted tire construction where the space separating the various belts is constant. Of course, as previously mentioned, tire mountable apparatus 100 may also be similarly mounted in a non-pneumatic wheel and tire such as the Tweel® non-pneumatic tire.

Based on the lateral orientation and the fact that the width dimension is relatively insignificant at least with respect to any bending or generation of strain from variations based on the rolling direction of the tire, 1-D tire mountable apparatus 100 sees primarily a monotonic radius change based on the tire's transverse profile changes with rotation.

Figure 3:
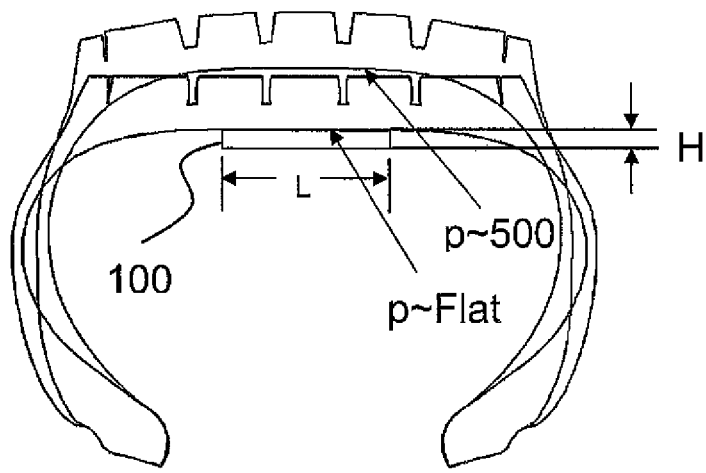
FIG. 3 representatively illustrates, in overlay, representations for comparison of transverse profiles at top of rotation and center of contact patch of a representative tire in which the present technology may be employed.

This later profile change concept may best be understood from a study of FIGS. 3 and 4. FIG. 3 representatively illustrates, in overlay, representations for comparison of transverse profiles at top of rotation and center of contact patch of a representative tire in which the present technology may be employed and illustrates in phantom the mounting orientation of tire mountable apparatus 100. FIG. 4 representatively illustrates variations in the radius of curvature of an exemplary tire in which the present technology may be employed. As generally represented in FIG. 3, for an exemplary normally inflated 275/80R22.5 tire, the transverse radius of curvature or profile (p) changes from p~500 mm with the tire at the top of its rotation to p~flat, i.e., a substantially infinite radius of curvature, at the center of the contact patch. Those of ordinary skill in the art will appreciate that the "contact patch" corresponds to the surface area of the tire in "contact" with the travel surface and that such surface is substantially "flat" over a generally smooth surface.

FIG. 4, on the other hand, illustrates that the circumferential radius of curvature (R) will vary between a substantially constant non-contact patch area, i.e., a substantially un-deflected portion of the tire, and a significantly higher radius of curvature within the contact patch during tire rotation and will produce two curvature peaks at entry and exit of the contact patch that increase with deflection. In accordance with present technology, 1-D tire mountable apparatus 100, due to the selection of width and the lengthwise mounting orientation in a tire, sees primarily a monotonic radius change from, for example, about 500 mm to flat, thereby avoiding two deflection-dependent circumferential peaks.

Exposure to primarily a monotonic radius change is one of the features of the present technology that results in enhanced endurance of the subject 1-D tire mountable apparatus. A second feature resulting from 1-D width selection, when a piezoelectric generator/sensor is associated with the tire mountable apparatus, is the substantial elimination of extraneous signal generation from longitudinal strain resulting from passage of the piezoelectric device-associated tire mountable apparatus through the entry and exit points to the tire contact patch. Such inherent signal filtering contributes to greater accuracy of signal processing for the various uses to which such signals may be placed within any particular usage environment.

Figure 6:
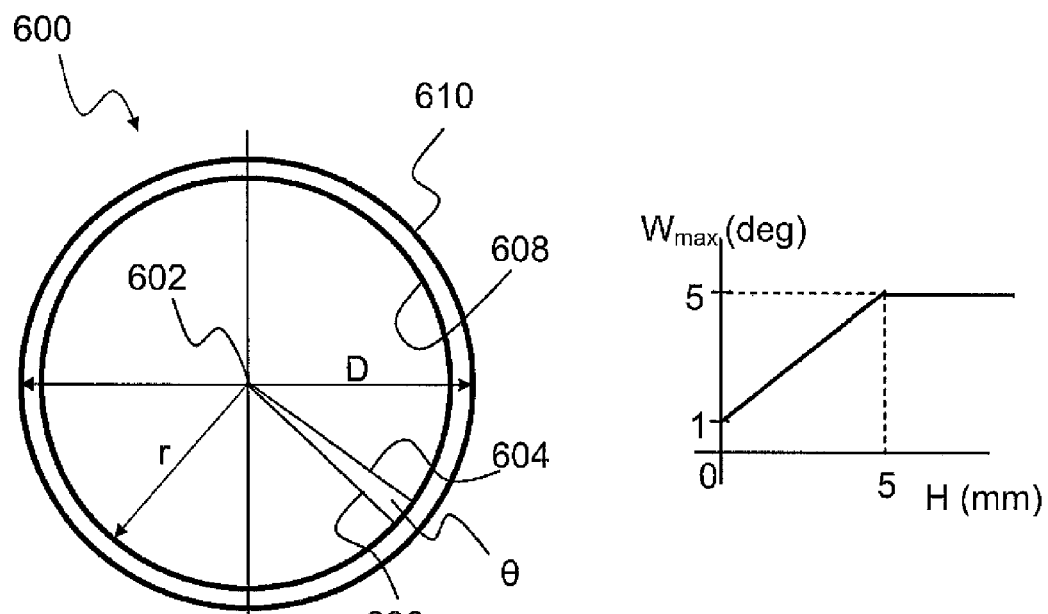
FIG. 6 generally represents a cross-section of an unloaded tire inflated at rated pressure useful in explaining the selection of the width dimension of a substrate in accordance with present technology.

With attention directed now to FIG. 6 it will be seen that the width W of the substrate portion of the tire mountable apparatus of the present subject matter may be selected by taking into consideration physical parameters of a tire at rated inflation pressure and under no load conditions. Such a tire is illustrated as tire 600 and has a uniform diameter D. Tire 600 has a radius r extending from a central rotational point 602 to the inner surface 608 of tire 600. Lines 604 and 606 extending from the central rotational point 602 to inner surface 608 establish an angle θ that, in accordance with technology is selected to be in the range of about 1° to about 5°, such as about 2° to about 4°, such as about 3°, or about 2°, or about 1° or any other angle or range of angles therebetween. Stated differently, the length of arc subtended along the inner surface 608 of tire 600 corresponds to about 1° to about 5° of rotation measured from line 604 extending from the center of rotation 602 to the inner surface 608 of the unloaded tire 600 when it is inflated to rated pressure. This length of arc established the maximum width W of the substrate.

By selecting the width W of 1-D tire mountable apparatus 100 to be narrow enough to substantially avoid strain from entry into and exit from the contact patch area, a number of benefits are obtained. As an initial benefit, strain on the 1-D tire mountable apparatus 100 per se is effectively limited to one direction thereby offering potential for prolonged life expectancy. In an exemplary configuration, for example in the previously noted exemplary 275/80R22.5 tire, width W may be selected to be less than about 30 mm. In any event, the width W should be limited to a dimension fitting within a tire inner surface dimension as described with relation to FIG. 6.

As previously referred to herein above, as tire 400, operating at rated pressure and rated load, rotates in the direction of arrow 418, two transition zones are created as the tire tread goes into and out of contact with the surface over which the tire is traveling. In the FIG. 4 example, the contact patch exit portion is identified as a transition portion or zone between lines 412, 414. A similar transition portion is, of course, formed at the entrance to the contact patch portion but has not been separately illustrated herein. As illustrated, the width W of tire mountable apparatus 100 is selected to fit entirely within this transition portion or zone so as to substantially avoid flexing of tire mountable apparatus 100 during passage through the transition portion. This leads to a second benefit, which is that generation of extraneous voltage signals from a mounted piezoelectric device from potential bending in a second direction is minimized.

Finally, by reducing the overall width, a more stable mounting orientation for terminal/support elements 110, 112 arranged in a line perpendicular to the primary strain direction is provided that reduces strain on mechanical and electrical coupling to devices and/or printed circuit boards as may be mounted thereon. In an exemplary configuration, the spacing between terminal/support elements 110, 112 may be selected to be less than about 18 mm.

With respect to overall length dimension determination, it will be appreciated from the previous discussion that the length L of 1-D tire mountable apparatus 100, that is, the lateral dimension with respect to a tire, should be minimized for endurance and maximized for energy generation. By orienting the mountable apparatus length laterally in the summit center, a structure is provided that very effectively increases device endurance while providing a device that is insensitive to tire deflection. As has been previously noted, the length L may be chosen such that tire mountable apparatus 100 lies in the tire summit between the shoulders and may extend over a significant portion of that area of a belted tire construction where the space separating the various belts is constant. In an exemplary configuration, the length L may be chosen to be at least twice the width W. In an exemplary configuration, it has been found experimentally that a 10× order of improvement to the distance to fatigue crack onset may be obtained by selecting such mounting orientation and length and width relationships.

Figure 7:
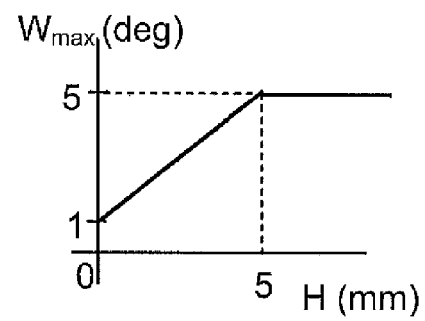
FIG. 7 graphically illustrates the relationship between the mesa height of an elastomeric patch usable with the tire mountable apparatus of the present technology and the width of a substrate selected in accordance with present technology expressed in degrees.

With reference now to FIG. 7, there is illustrated a relationship between the height H of optional elastomeric patch 108's mesa 106. The graph illustrates that the maximum width $W_{max}$ in terms of degrees is related to the height H of the mesa as a linear function up to a maximum mesa height H of 5 mm. In the instance that no elastomeric patch is employed, that is the substrate is adhered directly to the inner liner of the tire, $W_{max}$ is selected to be 1°. As the height H increases, $W_{max}$ increases linearly to a maximum of 5°. Generally this relationship may be defined as $W_{max}=(4/5)H+1$ for $0<H\le 5$. In all circumstances, however, the relationship L>W>H should be respected. Those of ordinary skill in the art will appreciate that the elastomeric patch, if present, provides a degree of isolation between the tire and the mounted apparatus 100. In the case of a piezoelectric sensor/generator being included, an increasing height H will produce a reduction in strain in the length L direction of the device. This, in turn, will produce less voltage generation from the piezoelectric device but will provide an increase in structural reliability so that a design balance should be taken into consideration in selecting the mesa height versus the length L whose selection determines the amount of voltage generated. In any event, the length L should not be so long as to cause the device to extend into the shoulder portion of the tire. The shoulder portion is understood to be that portion of the tire beyond the summit where the spacing of belt layers in a belted tire is no longer substantially constant when moving from the central portion of the summit toward the sidewalls.

Referring now to FIGS. 8-10, additional exemplary embodiments of a tire mountable apparatus according to the present technology will be discussed in detail. FIG. 8 depicts a plan view of an exemplary substrate 800 having a length L for use in a tire mountable apparatus. The length L of the substrate defines the longitudinal direction of the substrate. The substrate 800 may correspond to sandwich structure 200 as shown in FIG. 2 having a layer of piezoelectric material 202 with a first layer of conductive material 204 on one side thereof and a second layer of conductive material 204' on a second side thereof. The first layer of conductive material 204 is secured to a layer of insulating material 206 that acts as a supporting substrate for the sandwich structure 200. As set forth above, in certain embodiments, the piezoelectric material 202 may correspond to lead zirconium titanate (PZT), conductive materials 204, 204' may comprise copper layers, and insulating material 206 may correspond to a fire resistant substrate material commonly called FR4.

The substrate 800 may include a first piezoelectric device 810 and a second piezoelectric device 820. In one embodiment, first piezoelectric device 810 may correspond to a power piezoelectric generator while second piezoelectric device 820 may correspond to a signal piezoelectric generator. The power piezoelectric device 810 may be configured to provide power to various devices in the tire mountable apparatus and the signal piezoelectric device 820 may be configured to provide an isolated piezoelectric signal that is used for analytical purposes.

Substrate 800 includes a plurality of conductor terminals 840, 842, 844, and 846 on the substrate. Although only four conductor terminals 840, 842, 844, and 846 are illustrated in FIG. 8, using the teachings disclosed herein, those of ordinary skill in the art should understand that the present invention is not limited to any particular number of conductor terminals. For instance, the present technology may encompass two conductor terminals, four conductor terminals, six conductor terminals, five conductor terminals or any other number of conductor terminals.

The plurality of conductor terminals shown in FIG. 8 include a pair of outer conductor terminals 840, 842 and a pair of inner conductor terminals 844, 846. Conductor terminals 840, 842, 844, and 846 may be used to provide an electrical connection to first and second piezoelectric devices 810, 820 embedded in the substrate. For instance, the pair of outer conductor terminals 840, 842 may provide an electrical connection to first piezoelectric device 810 through conductive vias 850. The pair of inner conductor terminals 844, 846 may provide an electrical connection to second piezoelectric device 820 through conductive vias 850. Alternatively, the first piezoelectric device 810 may be operably connected to terminals 840 and 844 while the second piezoelectric device 820 may be operably connected to the other outer conductor terminal 842 and inner conductor terminal 846. Those of ordinary skill in the art should readily understand that the piezoelectric devices 810, 820 of the substrate 800 may be connected to any particular conductor terminal or combination of conductor terminals without deviating from the scope of the present invention.

Conductor terminals 840, 842, 844, and 846 may be any structure that can be used to establish an electrical connection between piezoelectric devices 810, 820 or conductive layers embedded in the substrate and various other devices or structures in the tire mountable apparatus. For example, conductor terminals 840, 842, 844, and 846 may be in the form of a conductive annulus, such as a copper annulus, that surrounds an opening adapted to receive an electrical connector or post. The conductive annulus may be operably connected to an electrical connector, post or other structure by threading the electrical connector, post or other structure through the opening in the conductive annulus. The conductive annulus will surround and be in contact with the electrical connector, post or other structure, establishing any necessary electrical connection. In particular embodiments, conductor terminals 844 and 846 may be in the form of conductive buttons, such as copper buttons. The conductive buttons provide an exposed conductive surface for electrical contact with an electrical connector or other structure.

In accordance with the present technology, conductor terminals 840, 842, 844, and 846 are arranged on the substrate 800 in a substantially linear relationship along line A-A. It should be appreciated that in the present context, use of the phrase "substantially linear relationship" is intended to signify that there may be a variation in alignment from a perfect linear relationship in the range from about ±0° to about ±20°, such as about ±5° to about ±15°, such as about ±8° to about ±12°, such as about ±10°, such as about ±5°, or about ±4°, or about ±3°, or about ±1° or any other variation in alignment or range of variation in alignment therebetween.

The conductor terminals 840, 842, 844, and 846 should be substantially aligned long line A-A, which is along a line about 80° to about 100° to the longitudinal direction of the substrate. The longitudinal direction of the substrate may be aligned substantially perpendicular to the direction of rotation of a supporting tire. Using the teachings disclosed herein, those of ordinary skill in the art should appreciate that the substrate 800 may have any number of lines of conductor terminals for attachment to a printed circuit board. For example, a substrate may have two lines of conductor terminals, three lines of conductor terminals, or any other number of conductor terminals.

As explained in detail above, when the 1-D substrate 800 is positioned in a tire in accordance with the present technology, bending of the substrate is limited to one dimension, i.e. the 1-D direction. Arranging the conductor terminals 842, 846 in a substantially linear relationship along line A-A minimizes strain at and between connections to devices connected to the conductor terminals 840, 842, 844, and 846 due to their perpendicular alignment to the primary strain direction. If, for example, on the other hand, the plurality of conductor terminals were to be along the primary bending line, separation distances between the conductor terminals would change with any bending along the primary bending line. Such would place a significant strain on any device or printed circuit board connected to the conductor terminals 840, 842, 844, and 846.

Referring now to FIG. 9, exemplary tire mountable apparatus 900 will be described in detail. As illustrated, exemplary tire mountable apparatus 900 includes a layer of elastomeric material 910, first support element 920, substrate 800, second support element 930, and printed circuit board 940. Substrate 800, which may be in the form of sandwich structure as shown in FIG. 2, may be supported on layer of elastomeric material 910 to form a patch that may be secured to the inner liner of a tire using standard tire patch repair methodologies. Elastomeric material 910 may be formed as a base portion 912 and a centrally located raised mesa portion 914 on which substrate 800 may be secured. As set forth above, the elastomeric material may correspond to a material composition normally employed as a sidewall material in the construction of pneumatic tires. Of course, tire mountable apparatus 900 may also be similarly mounted in a non-pneumatic wheel and tire such as the Tweel® non-pneumatic tire.

Embedded within optional layer of elastomeric material 910 is first support element 920. First support element 920 should have a degree of rigidity so as to provide mechanical support and protection for the conductor terminals 840, 842, 844, and 846 on the substrate as well as to provide mechanical support for other components of the tire mountable apparatus 900. The first support element 920 may be composed of any insulating or non-conductive material, such as, for example, FR4. As used herein, use of phrases like "insulating" or "non-conductive" material is intended to signify any material that is at least partially resistive to the flow of electric current or electrons through the material. The first support element 920 may be bonded to the optional layer of elastomeric material 910 through an adhesive such as Chemlok® available from LORD Corporation. In another embodiment, the first support element may be formed of a hard rubber or other rigid material that is embedded, integral, or a part of the optional layer of elastomeric material 910. In this embodiment, no adhesive is necessary to bond the first support element 920 to the optional layer of elastomeric material. The first support element 920 may also include rounded edges so as to minimize strain applied to the layer of elastomeric material 910.

As illustrated in FIG. 9, the first support element 920 is positioned so that it overlaps the plurality of conductor terminals 840, 842, 844, and 846 arranged on the substrate 800. In the present context, use of the phrase "overlaps the plurality of conductor terminals" is intended to include extending over or covering the conductor terminals either above or below the conductor terminals. In this manner the first support element 920 provides protection and support for the plurality of conductor terminals 840, 842, 844, and 846. First support element 920 may include a plurality of openings or other structures that may be used to establish an electrical connection between the printed circuit board 940 and the substrate 800. In certain embodiments, the first support element 920 has a width that is slightly larger than the width of the conductor terminals 840, 842, 844, and 846 to ensure complete overlap of the conductor terminals 840, 842, 844, and 846. However, the width of the first support element 920 should be minimized to avoid creating a large stress footprint on the printed circuit board 940 and so that mechanical stresses are dispersed onto different portions of the substrate 800. For instance, in particular embodiments having conductor terminals with maximum diameters of about 5.5 mm to about 6 mm, the first support element 920 may have a width of about 7.25 mm, with variances in this width being in the range of about ±0% to about ±20%, such as ±5% to about ±15%, such as about ±8% to ±12%, such as about ±10%, or about ±5%, or about ±4%, or about ±3%, or about ±1% or any other variation in width or range of variation in width therebetween.

Located above the substrate 800 is second support element 930. The second support element 930 acts as a spacer between the printed circuit board 940 and the substrate 800. The second support element 930 may have a height sufficient to prevent the printed circuit board 940 from contacting the substrate 800 when subject to mechanical stresses, such as, for example, during rotation of a tire. Second support element 930 may include a plurality of openings 935 that may be used for passage of various electrical connectors from the printed circuit board 940 to the substrate. Second support element 930, similar to first support element 920, may be formed of an insulating material, such as, for example, FR4. The second support element 930 works with the first support element 920 to provide mechanical support and protection for the plurality of conductor terminals 840, 842, 844, and 846. As illustrated, second support element 930 is positioned so that it overlaps the plurality of conductor terminals 840, 842, 844, and 846. The second support element 930 preferably has a width that is smaller than the width of the first support element 920 so that the stress line or footprint of second support element 930 and first support element 920 relative to the printed circuit board 940 is minimized. For instance, in particular embodiments wherein the first support element 920 has a width of about 7.25 mm, the second support element preferably has a width of about 6.25 mm, with variances in this width being in the range of about ±0% to about ±20%, such as ±5% to about ±15%, such as about ±8% to ±12%, such as about ±10%, or about ±5%, or about ±4%, or about ±3%, or about ±1% or any other variation in width or range of variation in width therebetween.

In the tire mountable apparatus 900, the plurality of conductor terminals 840, 842, 844, and 846 is positioned between the second support element 930 and the first support element 920. This structure provides the tire mountable apparatus enhanced operational and endurance characteristics. For instance, the second support element and first support element structure mechanically clamps the line of conductor terminals 840, 842, 844, and 846, reducing strain that may be applied to the conductor terminals. The second support element and first support element structure also helps preserve good electrical contact between conductors or piezoelectric devices embedded in the substrate 800 and the conductor terminals 840, 842, 844, and 846.

In particular embodiments, the tire apparatus may comprise solder in the interface between the first support element 920, the second support element 930, and/or the conductor terminals 840, 842, 844, and 846. The solder serves to provide corrosive protection and electrical for the plurality of conductor terminals 840, 842, 844, and 846 and to provide further protection for the interface between the first support element 920, the second support element 930, and/or the conductor terminals 840, 842, 844, and 846. The solder and the interface between the first support element 920, the second support element 930, and the conductor terminals 840, 842, 844, and 846 are provided further mechanical protection by a compression load applied to the first support element 920 and the second support element 930. This compression load may be provided by the fastening and tightening of printed circuit board 940 to posts 925.

As illustrated in FIG. 9, first support element 920 includes a pair of posts 925 that extend from the first support element 920. The posts 925 may be attached to the first support element 920 through nuts or sockets 922 embedded in the first support element 920. The posts 925 should be formed from a conductive material so that the posts may be used to establish an electrical connection between the printed circuit board 940 and the substrate 800. As illustrated in FIGS. 9 and 10a-10c, the posts 925 may extend through the pair of outer conductor terminals 840 and 842. In a particular embodiment, the posts 925 may be used to establish an electrical connection between the power piezoelectric device 810, which is connected to conductor terminals 840 and 842, with a printed circuit board 940. Conductor terminals 840 and 842 may be in the form of conductive annulus that surrounds and are contacts with the posts 925 so that any necessary electrical connection is established.

As illustrated, posts 925 extend through openings 935 in the second support element and are electrically and mechanically connected to the printed circuit board 940. Fasteners 926 may be used to mechanically connect the printed circuit board 940 to the posts 925. It should be appreciated that any printed circuit board 940 mounted to the corresponding posts 925 may be mounted in such a manner that the posts 925 provide all of the support for the printed circuit board. That is, the printed circuit boards may be mounted such that they are not supported by contact with any underlying structure other than the posts 925 and incident contact with the underlying second support element 930.

The tire mountable apparatus 900 may include one or more electrical connectors 950 configured to establish an electrical connection between the printed circuit board 940 and the substrate 800. These electrical connectors 950 are used for electrical connection only. Unlike the posts 925, the electrical connectors 950 do not provide any mechanical support for the tire mountable apparatus. Electrical connectors 950 may be any device or structure that establishes an electrical connection between the printed circuit board 940 and the substrate 800.

Figure 10A:
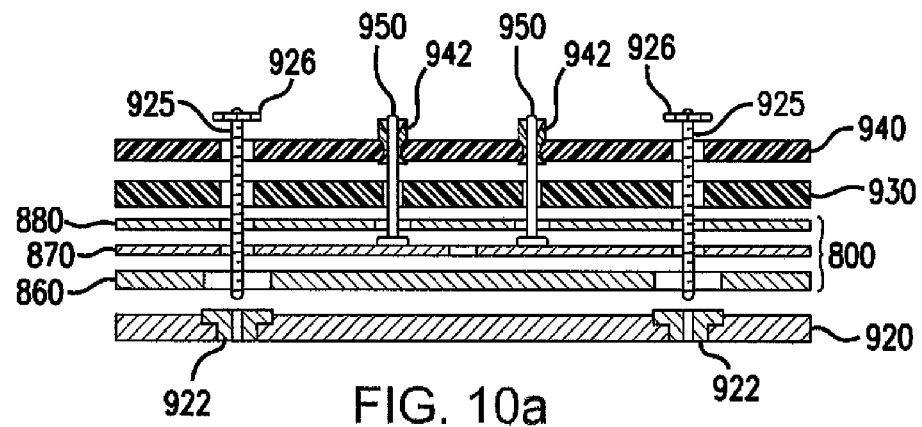
FIGS. 10a-10c representatively illustrate cross-sectional views of exemplary tire mountable apparatus in accordance with various embodiments of the present technology.
Figure 10B:
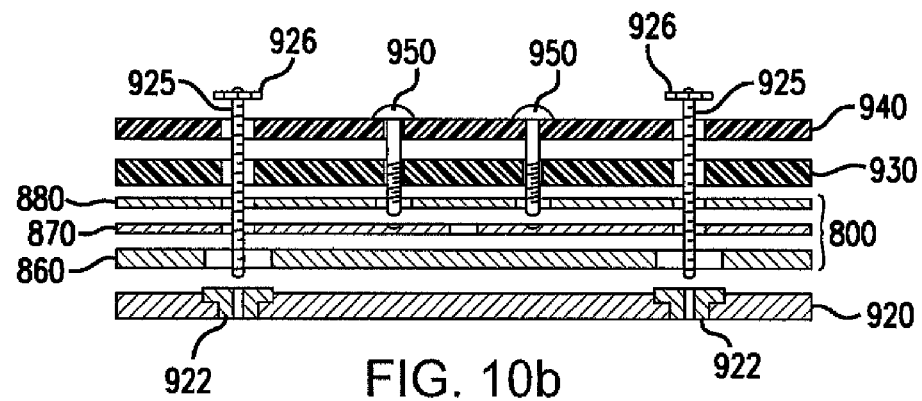
Figure 10C:
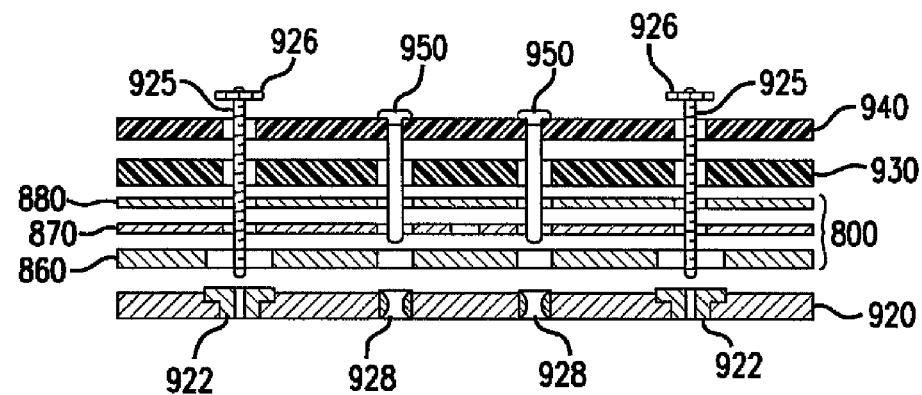

FIGS. 10a-10c provide a cross sectional view of the tire mountable apparatus 900 taken along the line of conductor terminals 840, 842, 844, and 846 of the substrate 800. As shown, the tire mountable apparatus includes the first support element 920, substrate 800, second support element 930 and printed circuit board 940. The substrate 800 is depicted as a layer of insulating material 860, a conductive layer 870, and another layer of insulating material 880. The conductive layer 870 may just be a single conductive layer embedded in the substrate, or it may correspond to the sandwich structure illustrated in FIG. 2, where two conductive layers 204 and 204' sandwich piezoelectric layer 202.

FIGS. 10a-10c illustrate that a plurality of different types of electrical connectors 950 may be used in accordance with the present technology. In FIG. 10a, the electrical connector 950 comprises a surface mount pin 950 that is operably connected to one of the inner conductor terminals 844, 846. In this embodiment, the inner conductor terminals 844, 846 may be in the form of conductive buttons that expose a conductive surface. The surface mount pin 950 is operably connected to the exposed conductive surface of the conductor terminal 844, 846. The surface mount pin 950 is also received into socket 942 on the printed circuit board 940, establishing the electrical connection between the inner conductor terminals 844 and 846 and the printed circuit board 940.

Another exemplary embodiment of an electrical connector 950 is illustrated in FIG. 10b. In this exemplary embodiment, the electrical connector 950 comprises a spring pin that is operably connected to the printed circuit board 940. Spring pin 950 may be compressed onto one of the inner conductor terminals 844, 846 to establish the electrical connection. For instance, the inner conductor terminals 844 and 846 may be in the form of conductive buttons that expose a conductive surface. When the printed circuit board 940 is mounted to the tire mountable apparatus 900, spring pin 950 may be compressed through the second support element 930 and onto the exposed conductive surface of the inner conductor terminals 844, 846, establishing the electrical connection between the inner conductor terminal 844, 846 and the printed circuit board 940.

Yet another exemplary embodiment of an electrical connector 950 is illustrated in FIG. 10c. In this embodiment, the first support element 920 includes a socket 928 for receiving pin 950 operably connected to the printed circuit board 940. The pin 950 passes through opening 935 in the second support element 930 and through one of the inner conductor terminals 844, 846. Inner conductor terminals 844, 846 may be in the form of a conductive annulus that surrounds and is in contact with the pin 950 to establish the electrical connection.

The electrical connector 950 of the present technology is not intended to be limited to any particular structure or device but may encompass any structure, device, or combination of structures or devices for establishing an electrical connection between the printed circuit board 940 and the substrate 800. For instance, the electrical connector may include any flex wire, spring pin, spring socket, pin and socket combination, pin and nut combination, or any other device or structure. In a particular embodiment, a fuzz button connector or interposer manufactured by Custom Interconnects may be used as the electrical connector 950.

The present technology provides for enhanced operational and endurance characteristics for the tire mountable apparatus. By arranging the terminal conductors of the substrate 800 in a substantially linear relationship, the substrate 800 may be used in accordance with the present technology to minimize stress applied to the conductor terminals and various devices or components attached to the conductor terminals. The present technology also allows for multiple electrical connections between various devices or components and the substrate without deviating from the various benefits provided by the 1-D tire mountable apparatus.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for reducing strain in a tire mounted assembly, comprising:
   providing a substrate defining a longitudinal direction, a top surface and a bottom surface, the substrate comprising a plurality of conductor terminals arranged in a substantially linear relationship;
   positioning a first support element beneath the bottom surface of the substrate so that the first support element overlaps the plurality of conductor terminals of the substrate; and
   positioning a second support element above the top surface of the substrate so that the second support element overlaps the plurality conductor terminals of the substrate;
   providing a pair of first and second posts extending from the first support element;
   connecting each of the first and second posts to one of the plurality of conductor terminals arranged on the substrate; and securing a printed circuit board to the pair of first and second posts such that the printed circuit board is supported above the second support element.

2. The method of claim 1, comprising:
positioning the conductor terminals of the substrate along a line about 80° to about 100° to the longitudinal direction of the substrate; and
mounting the substrate in a tire so that the longitudinal direction of the substrate is aligned substantially perpendicular to the direction of rotation of the tire.

3. The method of claim 1, wherein the substrate comprises a piezoelectric device comprising a piezoelectric layer positioned between a first conductor layer and a second conductor layer.

4. The method of claim 1, wherein the method comprises providing solder at an interface between the first support element, the second support element, and the plurality of conductor terminals.

5. The method of claim 4, wherein the method comprises providing a compression load to the interface between the first support element, the second support element, and the plurality of conductor terminals.

6. The method of claim 5, wherein the method comprises providing the compression load by tightening the connection between the printed circuit board and the first and second posts.

7. A method for reducing strain in a tire mounted assembly, comprising:
providing a substrate defining a longitudinal direction, a top surface and a bottom surface, the substrate comprising a plurality of conductor terminals arranged in a substantially linear relationship;
positioning a first support element beneath the bottom surface of the substrate so that the first support element overlaps the plurality of conductor terminals of the substrate; and
positioning a second support element above the top surface of the substrate so that the second support element overlaps the plurality conductor terminals of the substrate;
providing solder at an interface between the first support element, the second support element, and the plurality of conductor terminals; and
providing a compression load to the interface between the first support element, the second support element and the plurality of conductor terminals.

\* \* \* \* \*